United States Patent
Sugawara et al.

(10) Patent No.: US 9,252,335 B2
(45) Date of Patent: Feb. 2, 2016

(54) SEMICONDUCTOR LIGHT EMITTING ELEMENT AND METHOD FOR MANUFACTURING SAME

(71) Applicant: Kabushiki Kaisha Toshiba, Tokyo (JP)

(72) Inventors: Yasuharu Sugawara, Kanagawa (JP); Yuko Kato, Kanagawa (JP); Eiji Muramoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 13/770,308

(22) Filed: Feb. 19, 2013

(65) Prior Publication Data

US 2013/0164866 A1   Jun. 27, 2013

Related U.S. Application Data

(62) Division of application No. 12/878,967, filed on Sep. 9, 2010, now abandoned.

(30) Foreign Application Priority Data

Mar. 5, 2010   (JP) ................................. 2010-049418

(51) Int. Cl.
  *H01L 33/40*   (2010.01)
  *H01L 33/36*   (2010.01)
  (Continued)

(52) U.S. Cl.
  CPC ................ *H01L 33/40* (2013.01); *H01L 33/36* (2013.01); *H01L 33/48* (2013.01); *H01L 33/62* (2013.01); *H01L 33/38* (2013.01); *H01L 2224/48091* (2013.01); *H01L 2224/48247* (2013.01)

(58) Field of Classification Search
  CPC ......... H01L 33/36; H01L 33/38; H01L 33/40; H01L 33/44; H01L 33/486; H01L 33/62
  See application file for complete search history.

(56) References Cited

U.S. PATENT DOCUMENTS

2006/0006398 A1   1/2006 Hata
2008/0210955 A1   9/2008 Uemura et al.
(Continued)

FOREIGN PATENT DOCUMENTS

JP   2007-251112   9/2007
JP   2008186959 A   8/2008
(Continued)

OTHER PUBLICATIONS

Japanese Office Action dated Sep. 9, 2013, filed in Japanese counterpart Application No. 2012-168642.
(Continued)

*Primary Examiner* — Yu Chen
(74) *Attorney, Agent, or Firm* — Patterson & Sheridan, LLP (57) ABSTRACT

According to one embodiment, a semiconductor light emitting element includes a conductive substrate, a bonding portion, an intermediate metal film, a first electrode, a semiconductor stacked body and a second electrode. The bonding portion is provided on the support substrate and including a first metal film. The intermediate metal film is provided on the bonding portion and having a larger linear expansion coefficient than the first metal film. The first electrode is provided on the intermediate metal film and includes a second metal film having a larger linear expansion coefficient than the intermediate metal film. The semiconductor stacked body is provided on the first electrode and including a light emitting portion. The second electrode is provided on the semiconductor stacked body.

8 Claims, 11 Drawing Sheets

(51) Int. Cl.
  *H01L 33/48* (2010.01)
  *H01L 33/62* (2010.01)
  *H01L 33/38* (2010.01)

(56) References Cited

U.S. PATENT DOCUMENTS

| | | | |
|---|---|---|---|
| 2009/0278164 A1* | 11/2009 | Osawa et al. | 257/103 |
| 2010/0081256 A1* | 4/2010 | Uemura et al. | 438/462 |
| 2010/0136727 A1* | 6/2010 | Osawa et al. | 438/29 |
| 2011/0031519 A1* | 2/2011 | Hirao et al. | 257/98 |

FOREIGN PATENT DOCUMENTS

| | | |
|---|---|---|
| JP | 2009-054693 | 3/2009 |
| JP | 2009-099675 | 5/2009 |
| JP | 2010-016055 | 1/2010 |
| JP | 2011-077190 | 4/2011 |

OTHER PUBLICATIONS

Lide et al., CRC Handbook of Chemistry and Physics, 80th Edition. CRC Press, LLC., 1999, pp. 12-193 to 12-194.

Japanese Office Action dated Dec. 27, 2011, in Japanese counterpart application No. 2010-049418. 8 pages (Including English Translation).

Japanese Office Action dated May 25, 2012, in Japanese counterpart application No. 2010-049418. 10 pages (Including English Translation).

Japanese Office Action dated Dec. 8, 2014, filed in Japanese counterpart Application No. 2013-256911, 12 pages (with translation).

Japanese Office Action dated Apr. 2, 2015, filed in Japanese counterpart Application No. 2013-256911, 4 pages (with translation).

* cited by examiner

SEMICONDUCTOR LIGHT EMITTING ELEMENT AND METHOD FOR MANUFACTURING SAME

CROSS-REFERENCE TO RELATED APPLICATIONS

This application is a divisional of U.S. patent application Ser. No. 12/878,967, filed on Sep. 9, 2010, which is based upon and claims the benefit of priority from the prior Japanese Patent Application No. 2010-049418, filed on Mar. 5, 2010; the entire contents of which are incorporated herein by reference.

FIELD

Embodiments described herein relate generally to a semiconductor light emitting element and a method for manufacturing the same.

BACKGROUND

Recently, semiconductor light emitting elements with a sandwich electrode structure have been drawing attention. In this structure, the light emitting element is sandwiched between electrodes above and below the element. For instance, an LED (light emitting diode) is a typical example of such light emitting elements. A manufacturing process therefor is as follows. On a growth substrate made of sapphire, for instance, a semiconductor stacked body including a light emitting portion is formed. Next, a conductive substrate is bonded to a major surface of the semiconductor stacked body on the opposite side from the growth substrate. Then, the growth substrate is removed from the semiconductor stacked body. An electrode is formed on the surface of the semiconductor stacked body exposed by the removal of the growth substrate. Another electrode is formed on the conductive substrate.

With regard to the aforementioned process, a laser lift-off method has been proposed as a method for removing the growth substrate from the semiconductor stacked body. However, if the laser lift-off method is used to remove the growth substrate from the semiconductor stacked body, peeling may occur at the interface between the electrode of the semiconductor stacked body and the bonding portion, the bonding portion being interposed between the electrode and the conductive substrate. In this context, there is demand for improving the reliability and manufacturing yield of semiconductor light emitting elements.

BRIEF DESCRIPTION OF THE DRAWINGS

FIGS. 4A to 6C are schematic cross-sectional views sequentially describing an example process for manufacturing a semiconductor light emitting element;

FIGS. 9A to 11D are schematic cross-sectional views sequentially describing an example process for manufacturing a semiconductor light emitting element.

DETAILED DESCRIPTION

In general, according to one embodiment, a semiconductor light emitting element includes a conductive substrate, a bonding portion, an intermediate metal film, a first electrode, a semiconductor stacked body and a second electrode. The bonding portion is provided on the conductive substrate and including a first metal film. The intermediate metal film is provided on the bonding portion and having a larger linear expansion coefficient than the first metal film. The first electrode is provided on the intermediate metal film and includes a second metal film having a larger linear expansion coefficient than the intermediate metal film. The semiconductor stacked body is provided on the first electrode and including a light emitting portion. The second electrode is provided on the semiconductor stacked body.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings, the same components as those described previously with reference to earlier figures are labeled with like reference numerals, and the detailed description thereof is omitted as appropriate.

First Embodiment

Figure 1:
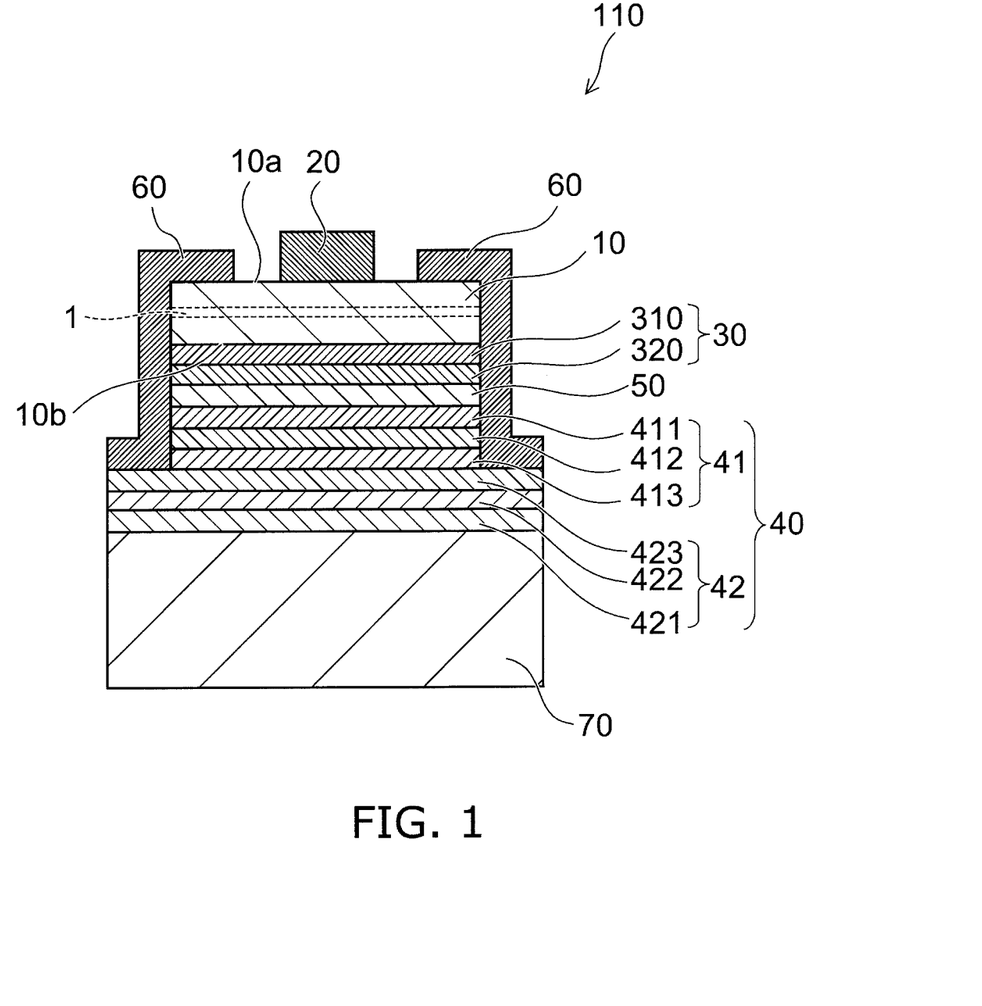
FIG. 1 is a schematic cross-sectional view describing an example structure of a semiconductor light emitting element according to a first embodiment.

FIG. 1 is a schematic cross-sectional view describing an example structure of a semiconductor light emitting element according to a first embodiment.

As shown in FIG. 1, the semiconductor light emitting element 110 according to the first embodiment includes a support substrate (a conductive substrate) 70, a bonding portion 40 provided on the support substrate 70, an intermediate metal film 50 provided on the bonding portion 40, a first electrode 30 provided on the intermediate metal film 50, a semiconductor stacked body 10 provided on the first electrode 30, and a second electrode 20 provided on the semiconductor stacked body 10.

The support substrate 70 is a substrate of a semiconductor such as silicon (Si) or germanium (Ge). Alternatively, the support substrate 70 may be made of a metal such as copper (Cu), molybdenum (Mo), or an alloy containing such metals.

The bonding portion 40 is a member bonding the semiconductor stacked body 10 to the support substrate 70. The bonding portion 40 includes a first bonding layer 41 previously provided on the first electrode 30 side, and a second bonding layer 42 previously provided on the support substrate 70 side. The bonding portion 40 is a bonded structure of the first bonding layer 41 and the second bonding layer 42. Hence, the first bonding layer 41 and the second bonding layer 42 may be either integrated together in the bonded state, or partly integrated, at the boundary therebetween.

The first bonding layer 41 is illustratively a metal multilayer film including a bonding metal film 411 (a first metal film in the semiconductor light emitting element), a bonding metal film 412, and a bonding metal film 413 stacked in this order from the first electrode 30 side. The bonding metal film 411 is illustratively made of Ti. The bonding metal film 412 is illustratively made of Pt. The bonding metal film 413 is illustratively made of Au.

The second bonding layer 42 is illustratively a metal multilayer film including a bonding metal film 421, a bonding metal film 422, and a bonding metal film 423 stacked in this order from the support substrate 70 side. The bonding metal film 421 is illustratively made of Ti. The bonding metal film 422 is illustratively made of Pt. The bonding metal film 423 is illustratively made of Au.

The first electrode 30 is provided on a second major surface 10b of the semiconductor stacked body 10 on the opposite side from its first major surface 10a. The first electrode 30 is illustratively a p-side main electrode of the semiconductor light emitting element 110. The first electrode 30 is illustratively a metal multilayer film. The first electrode 30 illustrated in FIG. 1 is a metal multilayer film including an electrode metal film 310 and an electrode metal film 320 (a second metal film in the semiconductor light emitting element) stacked in this order from the second major surface 10b of the semiconductor stacked body 10.

The electrode metal film 310 is illustratively made of Ni. The electrode metal film 310 provides ohmic contact with the semiconductor stacked body 10. The electrode metal film 320 is illustratively made of Ag. The electrode metal film 320 serves for electrical continuity with the electrode metal film 310. In addition, the electrode metal film 320 also functions as a reflective film for reflecting light emitted from the light emitting portion of the semiconductor stacked body 10.

The semiconductor stacked body 10 is illustratively an LED (light emitting diode). The semiconductor stacked body 10 includes a light emitting portion provided between the first semiconductor layer and the second semiconductor layer. By way of example, the light emitting portion has an MQW (multi-quantum well) structure of $In_{0.15}Ga_{0.85}N/In_{0.02}Ga_{0.98}N$. Blue color or violet color, for instance, is emitted from the light emitting portion.

The second electrode 20 is provided on at least part of the first major surface 10a of the semiconductor stacked body 10. The second electrode 20 is illustratively an n-side main electrode of the semiconductor light emitting element 110. The second electrode 20 is illustratively made of conductive film such as ITO (indium in oxide) or metal film. Alternatively, the second electrode 20 is illustratively made of a stacked body of AuGe/Mo/Au stacked in this order, a stacked body of Ti/Pt/Au stacked in this order, or a stacked body of Cr/Ti/Au stacked in this order from the first major surface 10a of the semiconductor stacked body 10. In the case of using ITO or a translucent metal film for the second electrode 20, light emitted from the semiconductor stacked body 10 can be extracted outside also from the electrode 20 side.

In the semiconductor light emitting element 110, an intermediate metal film 50 is provided between the electrode metal film 320 of the first electrode 30 and the bonding metal film 411 of the bonding portion 40 (first bonding layer 41). The linear expansion coefficient of the intermediate metal film 50 is smaller than the linear expansion coefficient of the electrode metal film 320, and larger than the linear expansion coefficient of the bonding metal film 411. The intermediate metal film 50 is illustratively made of Ni.

A protective film 60 is formed so as to cover a part of the first major surface 10a, a side surface of the semiconductor stacked body 10, a side surface of the first electrode 30, a side surface of the intermediate metal film 50, a side surface of the first bonding layer 41, and a part of upper surface of the second bonding layer 42.

In the semiconductor light emitting element 110, the intermediate metal film 50 as described above enhances adhesion between the first electrode 30 and the bonding portion 40 (first bonding layer 41). This suppresses peeling at the interface between the first electrode 30 and the bonding portion 40 when performing laser lift-off.

Figure 2:
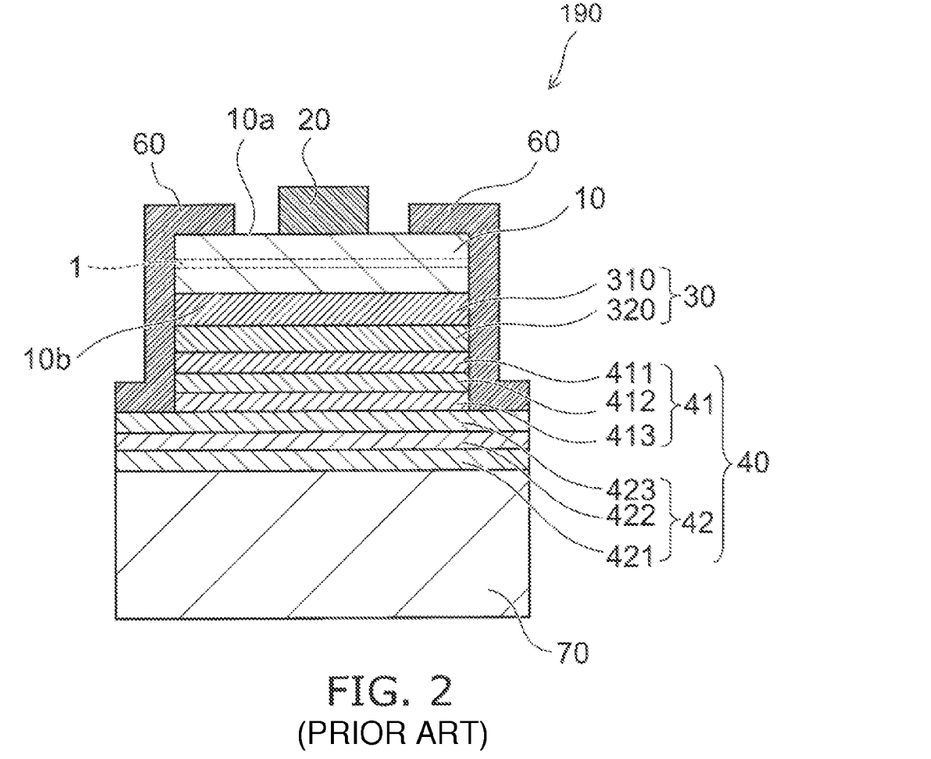
FIG. 2 is a schematic cross-sectional view describing an example structure of a semiconductor light emitting element according to a comparative example.

FIG. 2 is a schematic cross-sectional view describing an example structure of a semiconductor light emitting element according to a conventional example.

As shown in FIG. 2, the semiconductor light emitting element 190 according to the comparative example includes a support substrate 70, a bonding portion 40 provided on the support substrate 70, a first electrode 30 provided on the bonding portion 40, a semiconductor stacked body 10 provided on the first electrode 30, and a second electrode 20 provided on the semiconductor stacked body 10.

In the semiconductor light emitting element 190, the electrode metal film 320 of the first electrode 30 is directly bonded to the bonding metal film 411 of the first bonding layer 41 in the bonding portion 40. In contrast, the semiconductor light emitting element 110 includes an intermediate metal film 50 interposed therebetween. In this point, the semiconductor light emitting element 190 is different from the semiconductor light emitting element 110.

In the semiconductor light emitting element 190, because the electrode metal film 320 of the first electrode 30 is directly bonded to the bonding metal film 411 of the bonding portion 40, it is difficult to achieve sufficient bonding strength between the electrode metal film 320 and the bonding metal film 411. Hence, peeling may occur at the interface between the electrode metal film 320 and the bonding metal film 411 when the growth substrate is removed by laser lift-off.

In the semiconductor light emitting element 110 according to the first embodiment, an intermediate metal film 50 is provided between the electrode metal film 320 and the bonding metal film 411. In this configuration, the linear expansion coefficient difference between the electrode metal film 320 and the intermediate metal film 50, and the linear expansion coefficient difference between the intermediate metal film 50 and the bonding metal film 411, are smaller than the linear expansion coefficient difference between the electrode metal film 320 and the bonding metal film 411.

Adhesion strength between metal films is higher for a smaller linear expansion coefficient difference between the metal films. Hence, adhesion strength between metal films from the electrode metal film 320 to the bonding metal film 411 is higher in the semiconductor light emitting element 110 according to this embodiment than in the semiconductor light emitting element 190 according to the comparative example. Thus, separation at the interface between the electrode metal film 320 and the bonding metal film 411 is suppressed when the growth is removed by laser lift-off.

Figure 3:
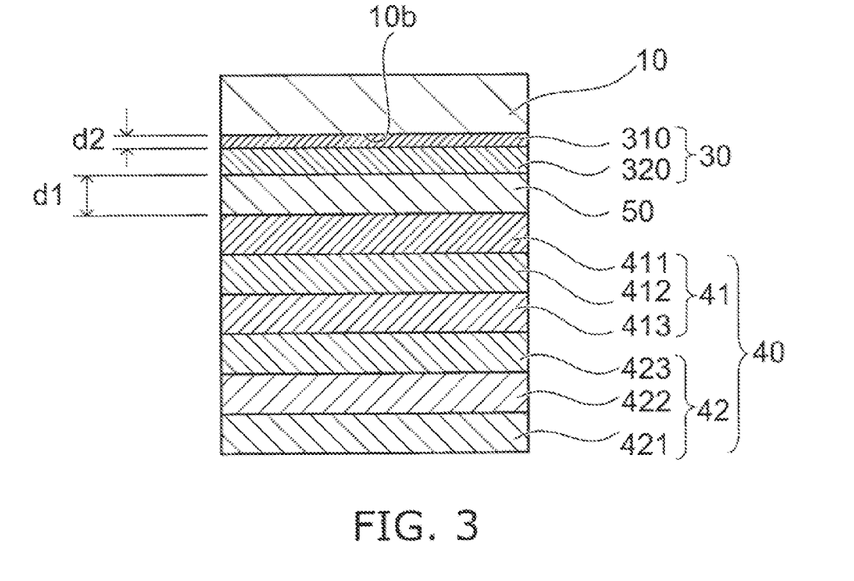
FIG. 3 is a schematic cross-sectional view describing an example configuration of the principal part of the semiconductor light emitting element according to the first embodiment.

FIG. 3 is a schematic cross-sectional view describing an example configuration of the principal part of the semiconductor light emitting element according to the first embodiment.

FIG. 3 primarily illustrates an example configuration of the semiconductor stacked body 10, the first electrode 30, and the bonding portion 40.

The first electrode 30 is a multilayer metal film including electrode metal films 310 and 320 stacked in this order from the second major surface 10b of the semiconductor stacked body 10.

The bonding portion 40 is a bonded structure of the first bonding layer 41 and the second bonding layer 42. The first bonding layer 41 is a multilayer metal film including bonding metal films 411, 412, and 413 stacked in this order from the first electrode 30 side.

As described earlier, the linear expansion coefficient of the intermediate metal film 50 lies between the linear expansion coefficient of the electrode metal film 320 and the linear expansion coefficient of the bonding metal film 411.

Here, the linear expansion coefficient of Ag used for the electrode metal film 320 is $19.1 \times 10^{-6}/°$ C. The linear expansion coefficient of Ti used for the bonding metal film 411 is $8.9 \times 10^{-6}/°$ C.

Besides Ni, the intermediate metal film 50 can illustratively be made of one selected from Pt, Rh, and Pd.

Here, the linear expansion coefficient of Ni is $13.3 \times 10^{-6}/°$ C. The linear expansion coefficient of Pt is $8.98 \times 10^{-6}/°$ C. The linear expansion coefficient of Rh is $9.6 \times 10^{-6}/°$ C. The linear expansion coefficient of Pd is $10.6 \times 10^{-6}/°$ C. Any of these linear expansion coefficients lies between the linear expansion coefficient of the electrode metal film 320 and the linear expansion coefficient of the bonding metal film 411. This decreases the linear expansion coefficient difference of metal films between the first electrode 30 and the first bonding layer 41, thereby enhancing adhesion strength.

The film thickness d1 of the intermediate metal film 50 may be larger than the film thickness d2 of the electrode metal film 310 (third metal film) of the first electrode 30. For instance, the film thickness d2 of the electrode metal film 310 is illustratively 1 nanometer (nm). On the other hand, the film thickness d1 of the intermediate metal film 50 is illustratively 50 nanometers (nm) or more and 150 nm or less. The film thickness d2 of the electrode metal film 310 is set to a thickness such as to transmit of light into the electrode metal film 320 used as a reflective film. On the other hand, the film thickness d1 of the intermediate metal film 50 is set to a thickness such as to relax stress between the electrode metal film 320 and the bonding metal film 411.

In the case of using GaN for the semiconductor stacked body 10, the intermediate metal film 50 serves to suppress diffusion of Ga from the semiconductor stacked body 10 into the bonding portion 40. Diffusion of Ga into the bonding portion 40 decreases bonding strength in the bonding portion 40. The intermediate metal film 50 suppresses the diffusion of Ga into the bonding portion 40, and hence can prevent the decrease of adhesion between the first electrode 30 and the bonding portion 40 (first bonding layer 41).

In view of sufficiently developing the function of suppressing the diffusion of Ga, it is desirable that the film thickness d1 of the intermediate metal film 50 be thicker than the film thickness d2 of the electrode metal film 310.

The electrode metal film 310 is illustratively made of the same material as the intermediate metal film 50. The electrode metal film 310 illustrated in FIG. 3 is made of the same material, e.g. Ni, as the intermediate metal film 50.

In the case of using Ag for the electrode metal film 320, the intermediate metal film 50 suppresses penetration of the first bonding layer 41 by Ag constituting the electrode metal film 320. This prevents the decrease of bonding strength between the first electrode 30 and the first bonding layer 41.

Second Embodiment

An example method for manufacturing a semiconductor light emitting element according to a second embodiment is described.

FIGS. 4A to 6C are schematic cross-sectional views sequentially describing an example process for manufacturing a semiconductor light emitting element 110.

Figure 4A:
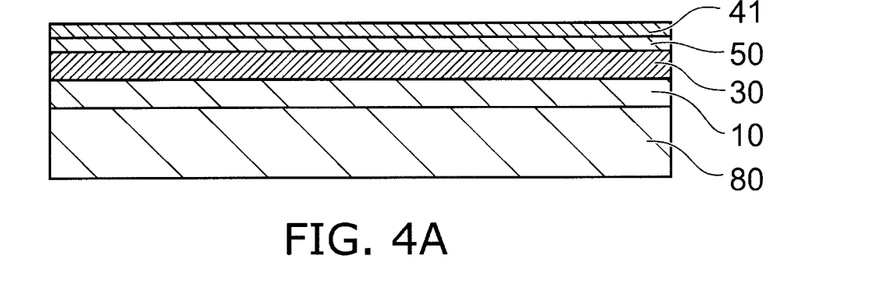

In this embodiment, a substrate illustratively made of sapphire is used as a growth substrate 80 for growing a semiconductor stacked body 10.

First, as shown in FIG. 4A, a semiconductor stacked body 10 is formed on the growth substrate 80. The thickness of the growth substrate 80 is illustratively 300-500 micrometers (μm). The semiconductor stacked body 10 is formed on the growth substrate 80 by epitaxial growth.

Next, a first electrode 30 is formed on the semiconductor stacked body 10. The first electrode 30 is illustratively a multilayer metal film of electrode metal films 310 and 320 (a first metal film in the manufacturing method). Subsequently, an intermediate metal film 50 is formed on the first electrode 30. Furthermore, a first bonding layer 41 is formed on the intermediate metal film 50. The first bonding layer 41 is illustratively a multilayer metal film of bonding metal films 411 (a second metal film in the manufacturing method), 412, and 413. The first electrode 30, the intermediate metal film 50, and the first bonding layer 41 are formed by sputtering or CVD (chemical vapor deposition), for instance.

Figure 4B:
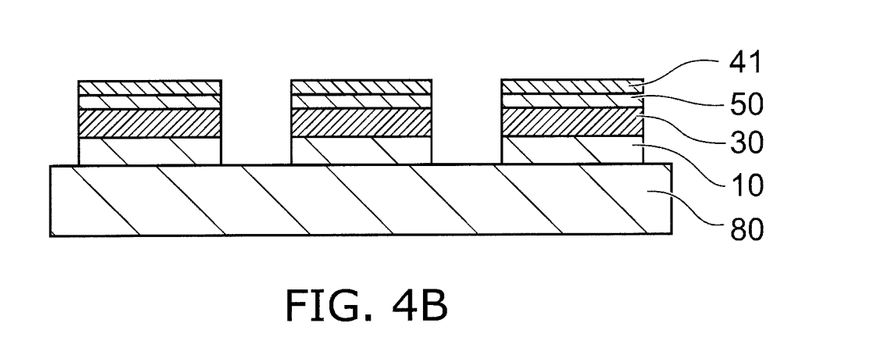

Next, as shown in FIG. 4B, the semiconductor stacked body 10, the first electrode 30, the intermediate metal film 50, and the first bonding layer 41 are selectively etched and divided on the growth substrate 80. The division is performed for each chip. By way of example, FIG. 4B shows a divided state corresponding to three chips. The etching process may be either dry etching or we etching. Alternatively, the division may be performed by laser processing.

Figure 4C:
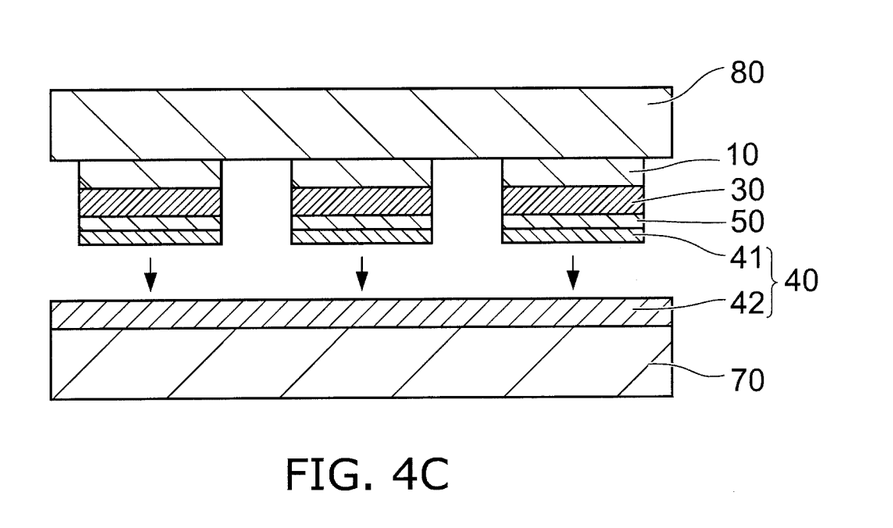

Next, as shown in FIG. 4C, a support substrate 70 with a second bonding layer 42 provided thereon is prepared. Then, the second bonding layer 42 is brought into face-to-face contact with the first bonding layer 41. Thus, the semiconductor stacked body 10, the first electrode 30, the intermediate metal film 50, and the bonding portion 40 (first bonding layer 41, second bonding layer 42) are sandwiched between the growth substrate 80 and the support substrate 70.

Then, heating treatment or ultrasonic treatment is performed to cause interdiffusion between the first bonding layer and the second bonding layer 42, thereby bonding them together. More specifically, with the first bonding layer 41 and the second bonding layer 42 opposed to each other, a load of e.g. 5 kgf/cm² or more and 500 kgf/cm² or less is applied thereto, and they are heated to e.g. 200° C. or more and 400° C. or less. This causes interdiffusion between the first bonding layer 41 and the second bonding layer 42, thereby forming a bonding portion 40. Thus, the semiconductor stacked body 10 and the support substrate 70 are bonded. The support substrate 70 also functions as a heat sink, for instance. Here, the first electrode 30 and the intermediate metal film 50 are interposed between the semiconductor stacked body 10 and the bonding portion 40.

Figure 5A:
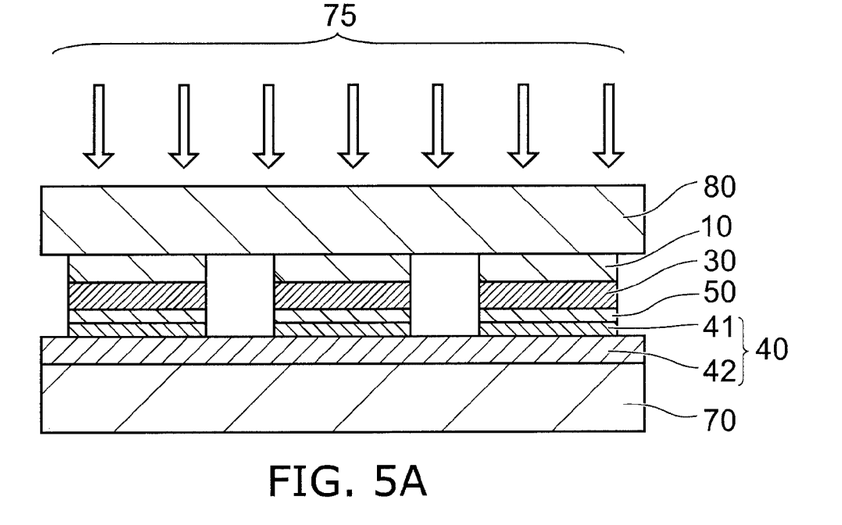

Next, as shown in FIG. 5A, laser lift-off (LLO) is performed to remove the growth substrate 80 from the semiconductor stacked body 10. Laser light 75 is produced using, for instance, an ArF laser (wavelength 193 nm), KrF laser (wavelength 248 nm), XeCl laser (wavelength 308 nm), or XeF laser (wavelength 353 nm).

The laser light 75 is transmitted through the growth substrate 80 to the semiconductor stacked body 10. Here, at the interface between the growth substrate 80 and the semiconductor stacked body 10, the semiconductor stacked body 10 absorbs the energy of the laser light 75. Thus, the III-V nitride components e.g. GaN in the semiconductor stacked body 10 is thermally decomposed as shown in the following reaction formula.

Figure 5B:
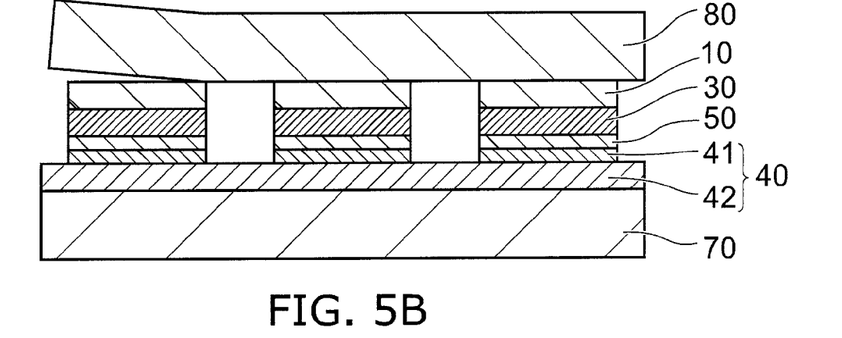

Consequently, as shown in FIG. 5B, the growth substrate 80 is removed from the semiconductor stacked body 10.

Figure 7:
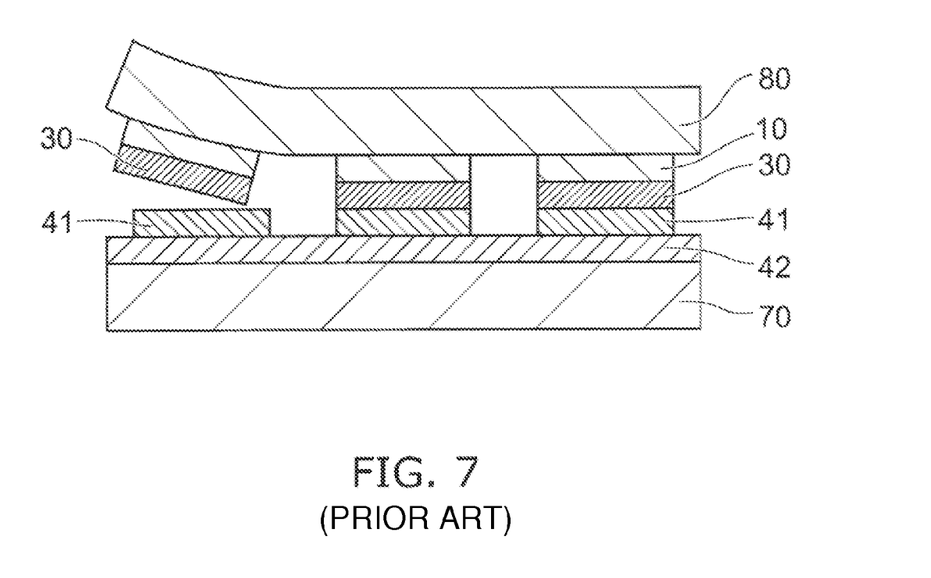
FIG. 7 is a schematic cross-sectional view describing part of a process for manufacturing the semiconductor light emitting element according to the comparative example.

FIG. 7 is a schematic cross-sectional view describing part of a process for manufacturing the semiconductor light emitting element 190 according to the comparative example.

FIG. 7 shows an example situation in which the same laser lift-off as in FIG. 5B is performed in the process for manufacturing the semiconductor light emitting element 190 according to the comparative example.

In the comparative example, the first electrode 30 is directly bonded to the first bonding layer 41. Because the intermediate metal film 50 used in this embodiment is not interposed, adhesion strength between the first electrode 30 and the first bonding layer 41 may be insufficient. For instance, between the first electrode 30 and the first bonding layer 41, stress has been accumulated by thermal history during bonding and laser lift-off. This stress causes the decrease of adhesion strength between the first electrode 30 and the first bonding layer 41.

If the growth substrate 80 in this state is removed by laser lift-off, peeling may occur between the first electrode 30 and the first bonding layer 41. This results in decreasing the reliability and manufacturing yield of the semiconductor light emitting element 190.

In contrast, as shown in FIG. 5B, in the manufacturing process according to this embodiment, the intermediate metal film 50 is provided between the first electrode 30 and the first bonding layer 41. Hence, there is a sufficient adhesion strength between the first electrode 30 and the first bonding layer 41. That is, because the intermediate metal film 50 is provided between the first electrode 30 and the first bonding layer 41, accumulation of stress due to thermal history during bonding and laser lift-off can be suppressed. Thus, a sufficient adhesion strength is maintained between the first electrode 30 and the first bonding layer 41.

This adhesion strength is sufficiently higher than the adhesion strength between the growth substrate 80 and the semiconductor stacked body 10 after irradiation with laser light 75. Hence, when the growth substrate 80 is removed by laser lift-off, peeling occurs between the growth substrate 80 and the semiconductor stacked body 10, and does not occur between the first electrode 30 and the first bonding layer 41. Furthermore, there is no degradation of the surface of the first electrode 30.

Figure 5C:
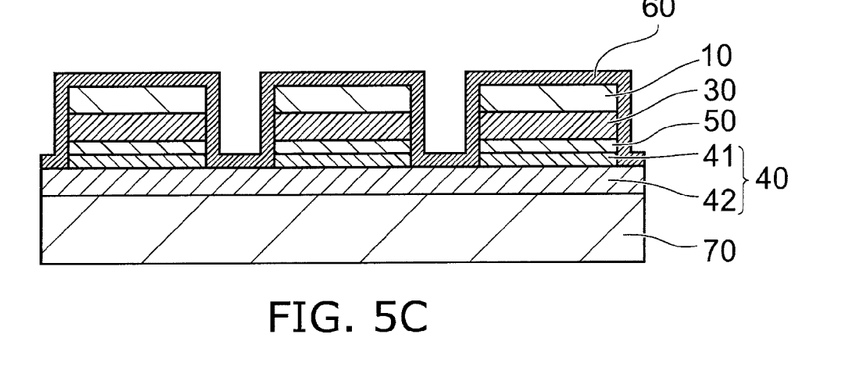

Next, as shown in FIG. 5C, a protective film 60 is formed so as to cover the semiconductor stacked body 10, the first electrode 30, the intermediate metal film 50, and the first bonding layer 41. The protective film 60 serves to reduce leakage and to protect the element. The protective film 60 is formed by sputtering, for instance. The film thickness of the protective film 60 is illustratively 100 nm or more and 400 nm or less. The protective film 60 is illustratively made of insulator.

Figure 6A:
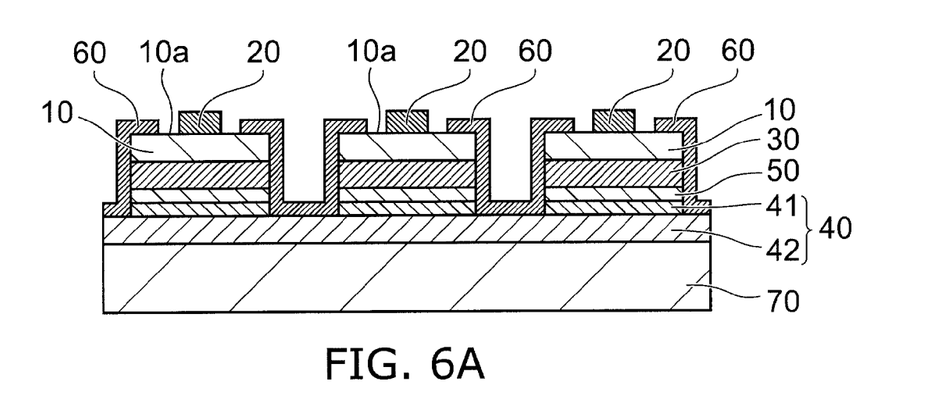

Next, as shown in FIG. 6A, the protective film 60 is selectively removed. More specifically, the protective film 60 on the first major surface 10a of the semiconductor stacked body 10 is selectively etched and removed. Then, a second electrode 20 is formed on the first major surface 10a of the semiconductor stacked body 10 exposed by the removal of the protective film 60. The second electrode 20 is illustratively a multilayer metal film of Ti/Pt/Au. The film thickness of Ti is illustratively 20 nm. The film thickness of Pt is illustratively 50 nm. The film thickness of Au is illustratively 700 nm. The second electrode 20 is formed by evaporation, for instance.

Figure 6B:
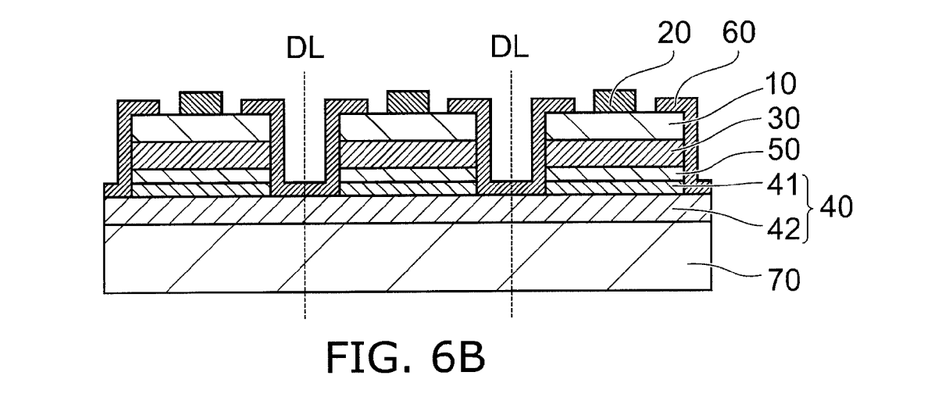
Figure 6C:
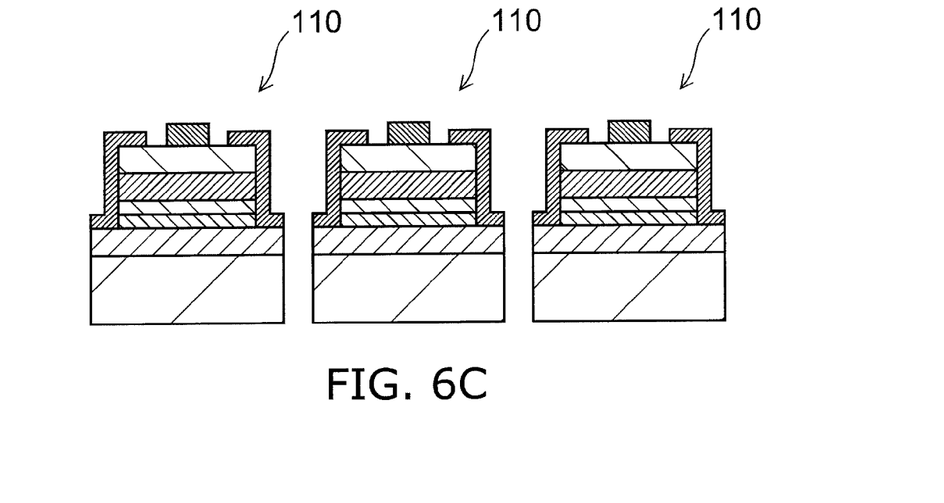

Subsequently, as shown in FIG. 6B, the support substrate 70 is cut (diced) along a dicing line DL. Thus, as shown in FIG. 6C, a semiconductor light emitting element 110 as a single chip is formed. In such a manufacturing method, no peeling occurs between the first electrode 30 and the first bonding layer 41 when the growth substrate 80 is removed by laser lift-off. Thus, the semiconductor light emitting element 110 having high reliability can be manufactured with high yield.

Third Embodiment

Figure 8A:
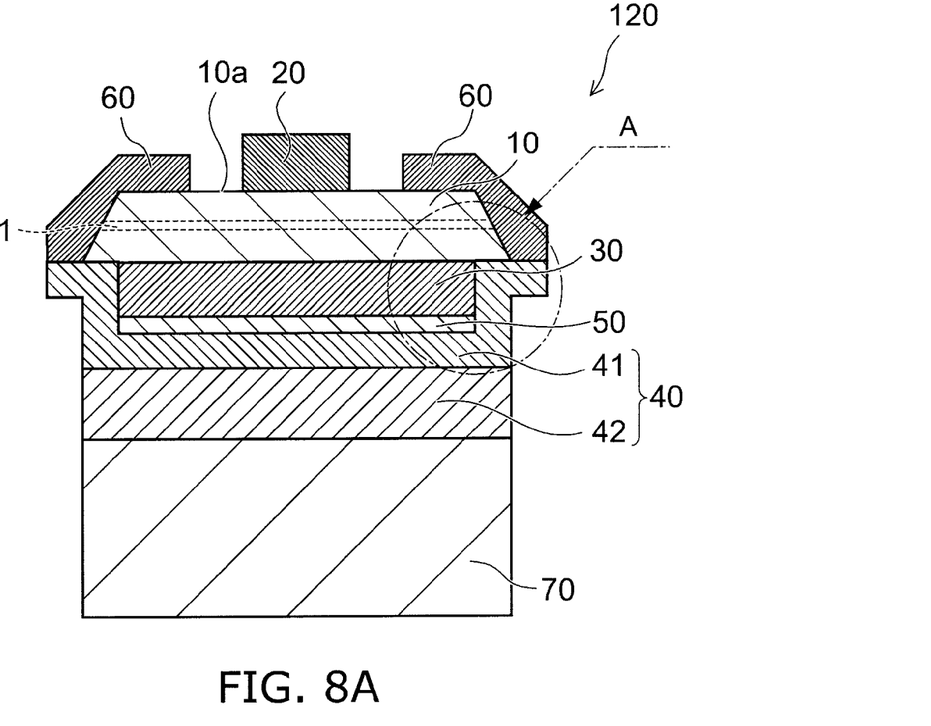
FIGS. 8A and 8B are schematic cross-sectional views describing an example structure of a semiconductor light emitting element according to a third embodiment.
Figure 8B:
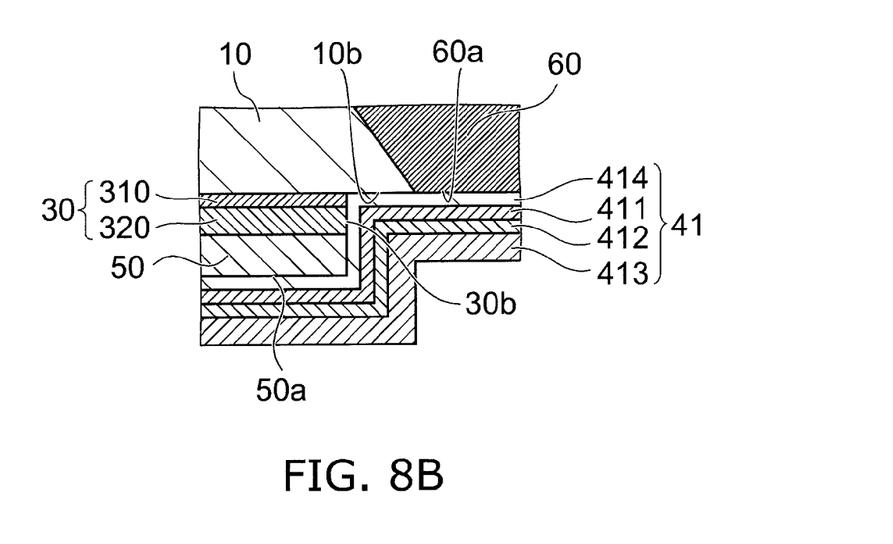

FIGS. 8A and 8B are schematic cross-sectional views describing an example structure of a semiconductor light emitting element according to a third embodiment.

FIG. 8A is a schematic cross-sectional view describing the overall structure of a semiconductor light emitting element 120.

FIG. 8B is a schematic cross-sectional view enlarging the portion A in FIG. 8A.

As shown in FIG. 8A, the semiconductor light emitting element 120 according to the third embodiment includes a support substrate (a conductive substrate) 70, a bonding portion 40 provided on the support substrate 70, an intermediate metal film 50 provided on the bonding portion 40, a first electrode 30 provided on the intermediate metal film 50, a semiconductor stacked body 10 provided on the first electrode 30, and a second electrode 20 provided on the semiconductor stacked body 10.

A side surface of the semiconductor stacked body 10 is slanted. A first major surface 10a of the semiconductor stacked body 10 has a smaller area than a second major surface 10b of the semiconductor stacked body 10.

A protective film 60 is formed so as to cover a part of a first major surface 10a of the semiconductor stacked body 10, a side surface of the semiconductor stacked body 10, and a part of upper surface of the first bonding layer 41.

The semiconductor light emitting element 120 according to the third embodiment is different from the semiconductor light emitting element 110 according to the first embodiment in that the first bonding layer 41 in the bonding portion 40 is in contact with at least an end surface 30b of the first electrode 30. The end surface 30b is also called a side surface or an edge surface.

Here, as shown in FIG. 8B, the first bonding layer 41 is a metal multilayer film of bonding metal films 411, 412, 413, and 414. In this metal multilayer film, the bonding metal film 414 is resistant to etching for the semiconductor stacked body 10. Furthermore, the bonding metal film 414 is in contact with at least the end surface 30b of the first electrode 30. The bonding metal film 414 illustrated in FIG. 8B is further in contact with the major surface 50a of the intermediate metal film 50, the second major surface 10b of the semiconductor stacked body 10, and the major surface 60a of the protective film 60.

The bonding metal film 414 is illustratively made of Ni. Because the end surface 30b of the first electrode 30 is covered with the bonding metal film 414 from the major surface 30a of the first electrode 30, the metal film of the first electrode 30 is protected during the manufacturing process. The bonding metal film 414 is resistant to etching for the semiconductor stacked body 10. Hence, the bonding metal film 414 functions as an etching stopper when the semiconductor stacked body 10 is etched during the manufacturing process.

With the bonding metal film 414 functioning as an etching stopper, unwanted etching can be suppressed during the etching of the semiconductor stacked body 10. Unwanted etching causes the etched portion to fly as dust. If metal is turned to dust, the dust is attached to the semiconductor light emitting element and causes leakage current. The semiconductor light emitting element 120 according to this embodiment can suppress the occurrence of leak current.

Fourth Embodiment

An example method for manufacturing a semiconductor light emitting element according to a fourth embodiment is described.

FIGS. 9A to 11D are schematic cross-sectional views sequentially describing an example process for manufacturing a semiconductor light emitting element 120.

Figure 9A:
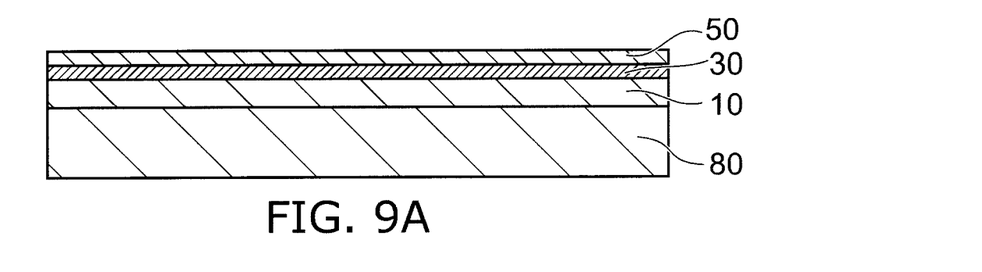

In this embodiment, a substrate illustratively made of sapphire is used as a growth substrate 80 for growing a semiconductor stacked body 10.

First, as shown in FIG. 9A, a semiconductor stacked body 10 is formed on the growth substrate 80. The thickness of the growth substrate 80 is illustratively 300-500 micrometers (μm). The semiconductor stacked body 10 is formed on the growth substrate 80 by epitaxial growth.

Next, a first electrode 30 is formed on the semiconductor stacked body 10. The first electrode 30 is illustratively a multilayer metal film of electrode metal films 310 and 320. Subsequently, an intermediate metal film 50 is formed on the first electrode 30. The first electrode 30 and the intermediate metal film 50 are formed by sputtering or CVD (chemical vapor deposition), for instance.

Figure 9B:
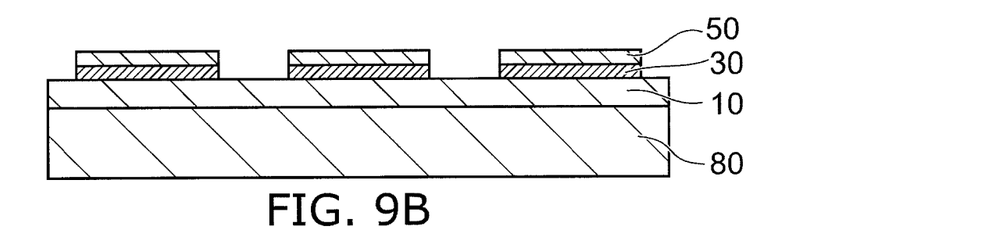

Next, as shown in FIG. 9B, the semiconductor stacked body 10, the first electrode 30, and the intermediate metal film 50 are selectively etched and divided on the growth substrate 80. The division is performed for each chip. By way of example, FIG. 9B shows a divided state corresponding to three chips. The etching process may be either dry etching or we etching. Alternatively, the division may be performed by laser processing.

Figure 9C:
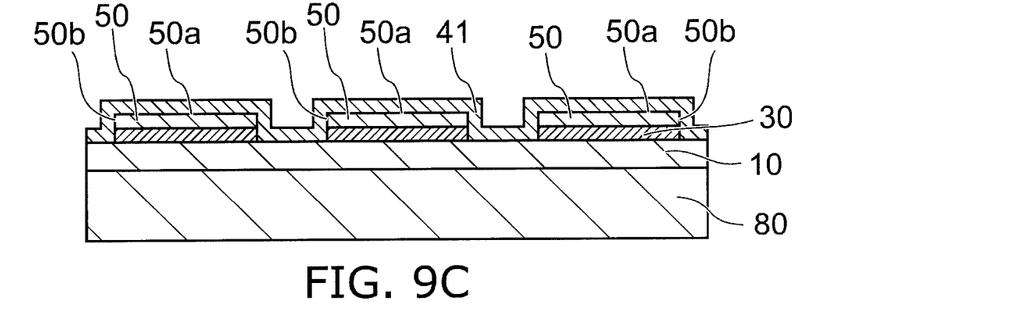

Next, as shown in FIG. 9C, a first bonding layer 41 is formed so as to cover the divided first electrode 30 and intermediate metal film 50 from above. The first bonding layer 41 is illustratively a multilayer metal film of bonding metal films 414, 411, 412, and 413. Here, the bonding metal film 414 is formed in contact with at least the end surface 30b of the first electrode 30. The bonding metal film 414 illustrated in FIG. 9C is formed on the major surface 50a and the end surface 50b of the intermediate metal film 50, the end surface 30b of the first electrode 30, and the second major surface 10b of the semiconductor stacked body 10.

Figure 9D:
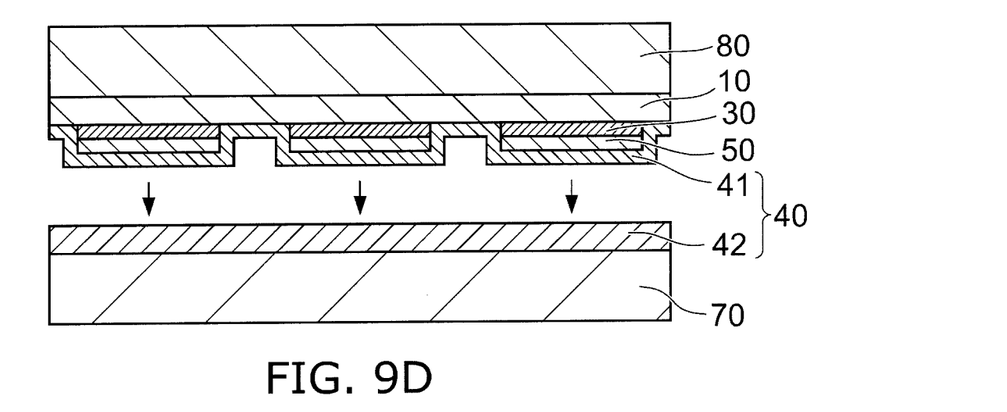

Next, as shown in FIG. 9D, a support substrate 70 with a second bonding layer 42 provided thereon is prepared. Then, the second bonding layer 42 is brought into face-to-face contact with the first bonding layer 41. Thus, the semiconductor stacked body 10, the first electrode 30, the intermediate metal film 50, and the bonding portion 40 (first bonding layer 41, second bonding layer 42) are sandwiched between the growth substrate 80 and the support substrate 70.

Then, heating treatment or ultrasonic treatment is performed to cause interdiffusion between the first bonding layer and the second bonding layer 42, thereby bonding them together. More specifically, with the first bonding layer 41 and the second bonding layer 42 opposed to each other, a load of e.g. 5 kgf/cm² or more and 500 kgf/cm² or less is applied thereto, and they are heated to e.g. 200° C. or more and 400° C. or less. This causes interdiffusion between the first bonding layer 41 and the second bonding layer 42, thereby forming a bonding portion 40. Thus, the semiconductor stacked body 10 and the support substrate 70 are bonded. The support substrate 70 also functions as a heat sink, for instance. Here, the first electrode 30 and the intermediate metal film 50 are interposed between the semiconductor stacked body 10 and the bonding portion 40.

Figure 10A:
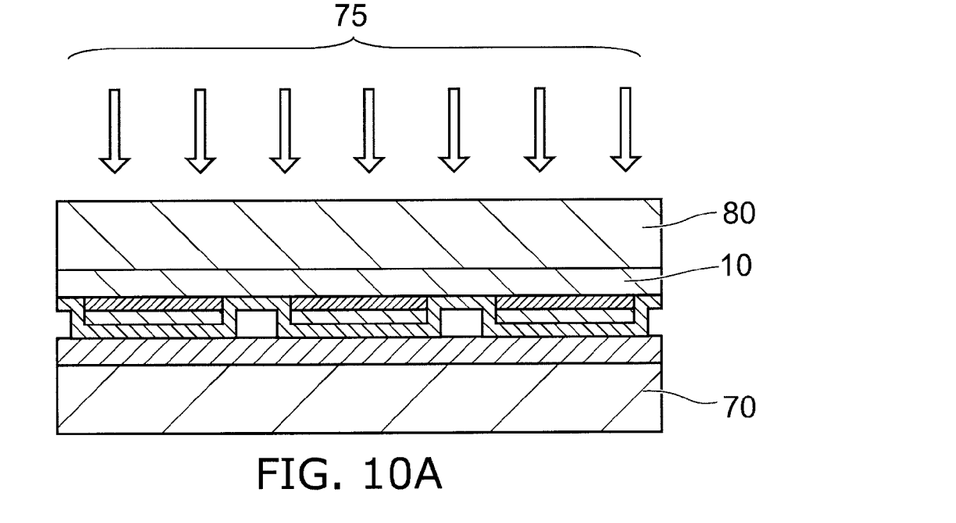

Next, as shown in FIG. 10A, laser lift-off (LLO) is performed to remove the growth substrate 80 from the semiconductor stacked body 10. Laser light 75 is produced using, for instance, an ArF laser (wavelength 193 nm), KrF laser (wavelength 248 nm), XeCl laser (wavelength 308 nm), or XeF laser (wavelength 353 nm).

The laser light 75 is transmitted through the growth substrate 80 to the semiconductor stacked body 10. Here, at the interface between the growth substrate 80 and the semiconductor stacked body 10, the semiconductor stacked body 10 absorbs the energy of the laser light 75. Thus, the III-V nitride components e.g. GaN in the semiconductor stacked body 10 is thermally decomposed as shown in the following reaction formula.

Figure 10B:
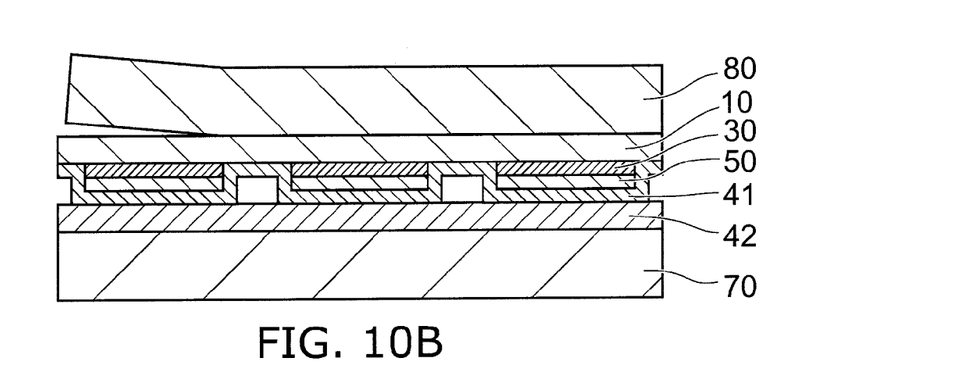

Consequently, as shown in FIG. 10B, the growth substrate 80 is removed from the semiconductor stacked body 10.

In the manufacturing process according to this embodiment, the intermediate metal film 50 is provided between the first electrode 30 and the first bonding layer 41. Hence, there is a sufficient adhesion strength between the first electrode 30 and the first bonding layer 41. This adhesion strength is sufficiently higher than the adhesion strength between the growth substrate 80 and the semiconductor stacked body 10 after irradiation with laser light 75. Hence, when the growth substrate 80 is removed by laser lift-off, peeling occurs between the growth substrate 80 and the semiconductor stacked body 10, and does not occur between the first electrode 30 and the first bonding layer 41.

Figure 10C:
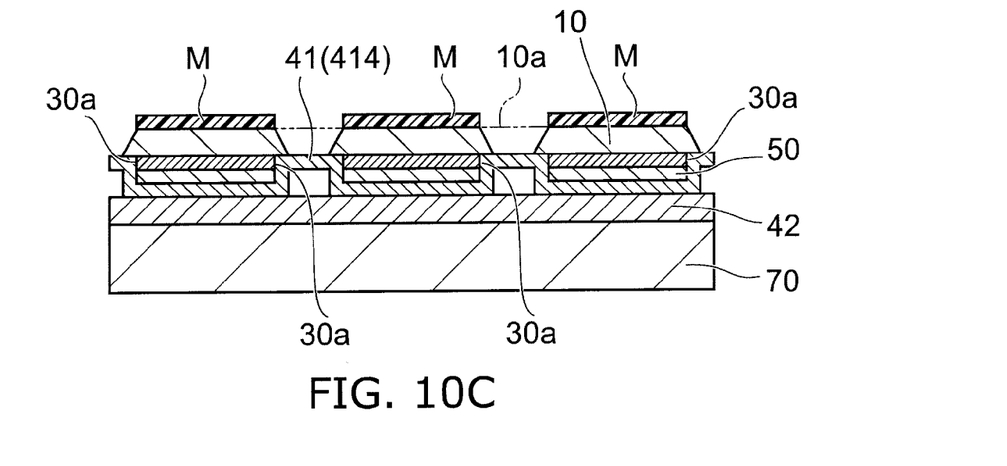

Next, as shown in FIG. 10C, a mask material M such as resist is provided on the semiconductor stacked body 10, and the semiconductor stacked body 10 is etched at the position between the chips, so as to a side surface of the semiconductor stacked body 10 is tapered. The etching is performed by RIE (reactive ion etching), for instance.

The etching of the semiconductor stacked body 10 proceeds from the first major surface 10a. When the etching reaches the bonding metal film 414 of the first bonding layer 41, the bonding metal film 414 serves as an etching stopper film. The bonding metal film 414 has a sufficient etching selection ratio with respect to the semiconductor stacked body 10. Thus, the etching of the semiconductor stacked body 10 stops at the position of the bonding metal film 414.

Furthermore, the bonding metal film 414 is in contact with the end surface 30b of the first electrode 30. Hence, during the etching of the semiconductor stacked body 10, the end surface 30b of the first electrode 30 is protected by the bonding metal film 414, and can be prevented from being etched. Thus, the manufacturing process according to this embodiment suppresses the occurrence of metal dust during the etching of the semiconductor stacked body 10. Hence, the occurrence of leak current can be suppressed in the completed semiconductor light emitting element.

Figure 11A:
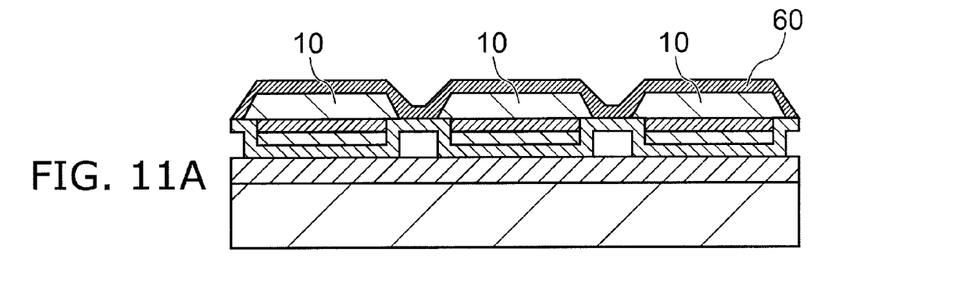

Next, as shown in FIG. 11A, a protective film 60 is formed on the semiconductor stacked body 10. The protective film 60 serves to reduce leakage and to protect the element. The protective film 60 is formed by sputtering, for instance. The film thickness of the protective film 60 is illustratively 100 nm or more and 400 nm or less.

Figure 11B:
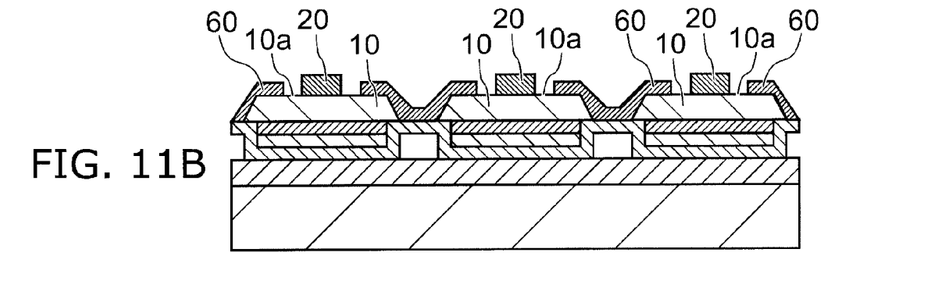

Next, as shown in FIG. 11B, the protective film 60 is selectively removed. More specifically, the protective film 60 on the first major surface 10a of the semiconductor stacked body 10 is selectively etched and removed. Then, a second electrode 20 is formed on the first major surface 10a of the semiconductor stacked body 10 exposed by the removal of the protective film 60. The second electrode 20 is illustratively a multilayer metal film of Ti/Pt/Au. The film thickness of Ti is illustratively 20 nm. The film thickness of Pt is illustratively 50 nm. The film thickness of Au is illustratively 700 nm. The second electrode 20 is formed by evaporation, for instance.

Figure 11C:
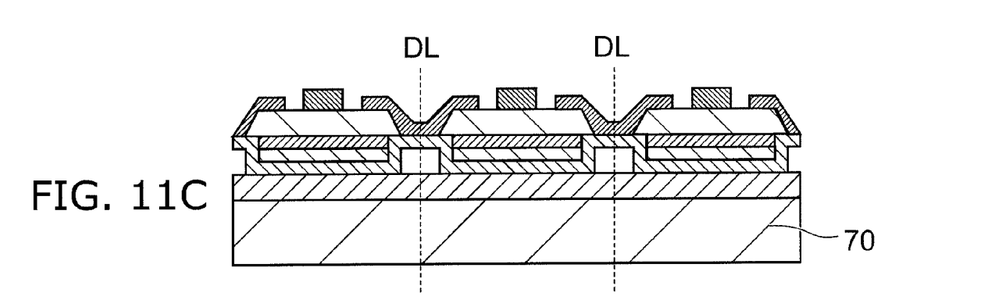
Figure 11D:
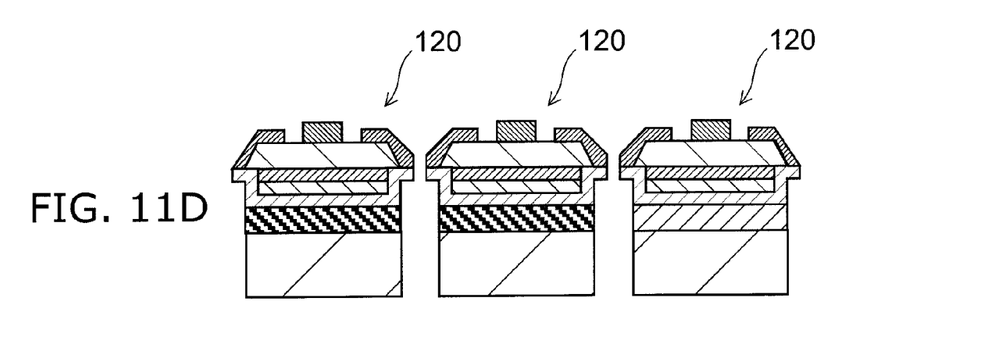

Subsequently, as shown in FIG. 11C, the support substrate 70 is cut (diced) along a dicing line DL. Thus, as shown in FIG. 11D, a semiconductor light emitting element 120 as a single chip is formed. In such a manufacturing method, peeling is suppressed between the first electrode 30 and the first bonding layer 41 when the growth substrate 80 is removed by laser lift-off. Furthermore, the occurrence of leak current due to metal dust is suppressed. Thus, the semiconductor light emitting element 120 having high reliability can be manufactured with high yield.

Fifth Embodiment

Figure 12:
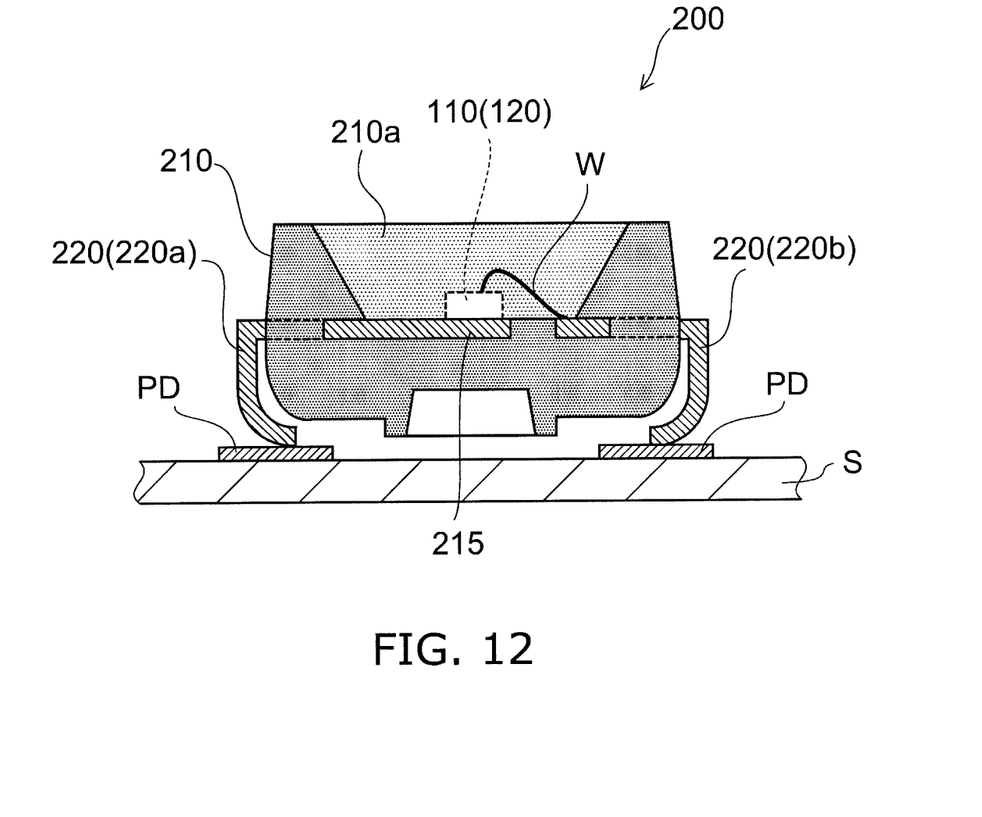
FIG. 12 is a schematic cross-sectional view describing an example configuration of a semiconductor light emitting device according to a fifth embodiment.

FIG. 12 is a schematic cross-sectional view describing an example configuration of a semiconductor light emitting device according to a fifth embodiment.

The semiconductor light emitting device 200 includes a semiconductor light emitting element 110 (120), a molded body 210 enclosing the semiconductor light emitting element 110 (120), and terminals 220 being in electrical continuity with the semiconductor light emitting element 110 (120) and provided outside the molded body 210.

The chip-shaped semiconductor light emitting element 110 (120) is mounted on a die 215. The semiconductor light emitting element 110 (120) is mounted on the die 215 via a metal film provided on the support substrate 70 side. This brings the first electrode 30 of the semiconductor light emitting element 110 into electrical continuity with the die 215.

The die 215 is in electrical continuity with one terminal 220a. The second electrode 20 of the semiconductor light emitting element 110 (120) is connected to the other terminal 220b via a connecting wire W such as a bonding wire. The terminals 220 (220a and 220b) extend outside from the side surface of the molded body 210, for instance, and are bent from the side surface to the rear surface along the outline of the molded body 210.

The semiconductor light emitting device 200 is of the SMD (surface mount device) type.

The molded body 210 is a packaging member enclosing the semiconductor light emitting element 110 (120), the die 215, and part of the terminals 220. In the molded body 210, the emission surface side 210a for light emission is translucent. If necessary, the emission surface side 210a of the molded body 210 is provided with phosphor.

The semiconductor light emitting device 200 is mounted on a substrate S. On the rear surface side of the molded body 210, the terminals 220 (220a and 220b) of the semiconductor light emitting device 200 are bonded with solder to pads PD provided on the substrate S. Thus, the semiconductor light emitting device 200 is mechanically fixed onto the substrate S, and electrically connected to a circuit (not shown) provided on the substrate S.

Such a semiconductor light emitting device 200 is operable to emit light with high reliability because the semiconductor light emitting element 110 (120) according to the embodiments is used therein.

It is noted that the semiconductor light emitting device 200 is also applicable to any type other than the SMD type.

The embodiments of the invention have been described. However, the invention is not limited to these examples.

For instance, in the semiconductor light emitting element 110 (120), the intermediate metal film 50 may be provided as the lowermost layer of the first electrode 30. Alternatively, the intermediate metal film 50 may be provided as the uppermost layer of the bonding portion 40.

Furthermore, for instance, an electronic circuit capable of processing light signals emitted from the semiconductor light emitting element 110 (120) can be integrated on the same support substrate 70 to form an optoelectronic integrated circuit. Such an optoelectronic integrated circuit is also encompassed in the embodiments.

Furthermore, the components of the above embodiments can be combined with each other as long as technically feasible, and such combinations are also encompassed within the scope of the invention as long as they include the features of the invention.

Furthermore, those skilled in the art can conceive various modifications and variations within the spirit of the invention, and it is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light emitting element comprising:
   a support substrate;
   a semiconductor stacked body including a light emitting portion, the semiconductor stacked body having a first surface and a second surface opposite to the first surface;
   a first electrode provided between the second surface and the support substrate;
   a bonding portion provided between the first electrode and the support substrate; and
   a film covering a side surface of the semiconductor stacked body, the bonding portion covering the first electrode, the bonding portion being in contact with the support substrate, the bonding portion including a first portion and a second portion the first portion provided between the first electrode and the second portion, the first portion extending beyond an outer edge of the second portion in a first direction that is parallel to the second surface, the first portion having a third surface that is parallel to the second surface, and the semiconductor stacked body and the film each having a portion contacting the first portion along the third surface.

2. The semiconductor light emitting element according to claim 1, wherein
   the first electrode has a first film being made of metal,
   the first portion of the bonding portion includes:
      a second film being made of metal, the second film being in contact with the second surface, the second film having a linear expansion coefficient smaller than a linear expansion coefficient of the first film; and
      a third film being made of metal, the third film provided between the second film and the support substrate, the third film having a linear expansion coefficient smaller than a linear expansion coefficient of the second film.

3. The semiconductor light emitting element according to claim 2, wherein
the second film includes an intermediate metal film, the intermediate metal film being in contact with the first film, and
the intermediate metal film being made of one selected from Ni, Pt, Rh, and Pd.

4. The semiconductor light emitting element according to claim 2, wherein
the first film includes Ag, and
the third film includes Ti.

5. The semiconductor light emitting element according to claim 1, wherein the side surface of the semiconductor stacked body is inclined to a plane which is orthogonal to the third surface.

6. The semiconductor light emitting element according to claim 1, wherein the first surface has a surface area in a first plane parallel to the third surface that is smaller than a surface area of the second surface in a second plane parallel to the third surface.

7. The semiconductor light emitting element according to claim 1, wherein a length in the first direction of the first portion of the bonding portion along the third surface is greater than a length in the first direction of the portion of the semiconductor stacked body along the third surface.

8. A semiconductor light emitting device, comprising:
a semiconductor light emitting element;
a molded body enclosing the semiconductor light emitting element; and
a terminal being in electrical continuity with the semiconductor light emitting element, the terminal provided outside the molded body,
the semiconductor light emitting element including:
a support substrate;
a semiconductor stacked body including a light emitting portion, the semiconductor stacked body having a first surface and a second surface opposite to the first surface;
a first electrode provided between the second surface and the support substrate;
a bonding portion provided between the first electrode and the support substrate; and
a film covering a side surface of the semiconductor stacked body,
the bonding portion covering the first electrode, the bonding portion being in contact with the support substrate, the bonding portion including a first portion and a second portion the first portion provided between the first electrode and the second portion, the first portion extending beyond an outer edge of the second portion in a first direction that is parallel to the second surface, the first portion having a third surface that is parallel to the second surface, and the semiconductor stacked body and the film each having a portion contacting the first portion along the third surface.

* * * * *